(12) United States Patent
Ueda

(10) Patent No.: US 7,602,610 B2
(45) Date of Patent: Oct. 13, 2009

(54) ELECTRONIC DEVICE

(75) Inventor: Hiroshi Ueda, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 11/873,972

(22) Filed: Oct. 17, 2007

(65) Prior Publication Data
US 2008/0123263 A1 May 29, 2008

(30) Foreign Application Priority Data
Nov. 28, 2006 (JP) ............................ 2006-320374

(51) Int. Cl.
H05K 7/20 (2006.01)
(52) U.S. Cl. ................... 361/701; 361/702; 361/718; 165/80.4; 165/104.33; 257/E23.088
(58) Field of Classification Search .................. None
See application file for complete search history.

(56) References Cited

U.S. PATENT DOCUMENTS

| 6,504,720 B2 | 1/2003 | Furuya | |
| 6,935,412 B2 * | 8/2005 | Mueller | 165/80.4 |
| 6,942,019 B2 * | 9/2005 | Pikovsky et al. | 165/80.4 |
| 6,961,244 B2 * | 11/2005 | Tsuchiya et al. | 361/710 |
| 7,184,265 B2 * | 2/2007 | Kim et al. | 361/679.47 |

FOREIGN PATENT DOCUMENTS

| JP | 2000-146470 | 5/2000 |
| JP | 2001-110969 | 4/2001 |
| JP | 2003-110072 | 4/2003 |
| JP | 2003-124413 | 4/2003 |
| JP | 3452060 | 7/2003 |

* cited by examiner

Primary Examiner—Jayprakash N Gandhi
Assistant Examiner—Courtney Smith
(74) Attorney, Agent, or Firm—Blakely, Sokoloff, Taylor & Zafman LLP

(57) ABSTRACT

According to one embodiment, an electronic device is provided with a heat transfer unit and a pressing member. The heat transfer unit includes a heat receiving portion thermally connected to a heat generating component, a heat radiating section thermally connected to a heat radiating part, and a plurality of passages through which fluid flows. The heat transfer unit includes first and second members being flexible and mutually bonded. The second member includes a plurality of passage parts which form spaces to be the passages between the first member and the second member, and a flat part being located between the adjacent passage parts and in contact with the first member. The pressing member presses the flat part toward the heat generating component, avoiding the plurality of passage parts.

10 Claims, 13 Drawing Sheets

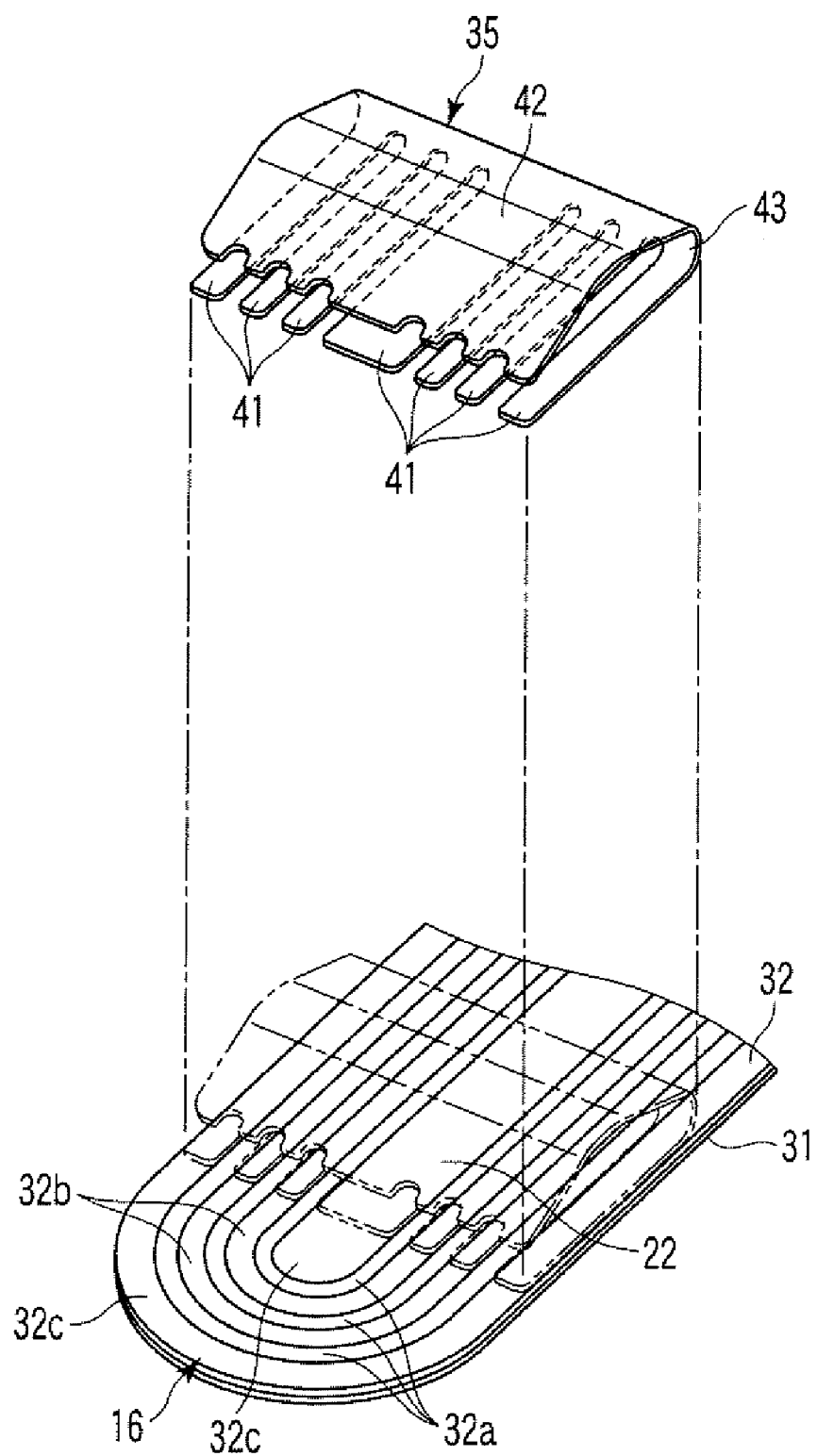
F I G. 5

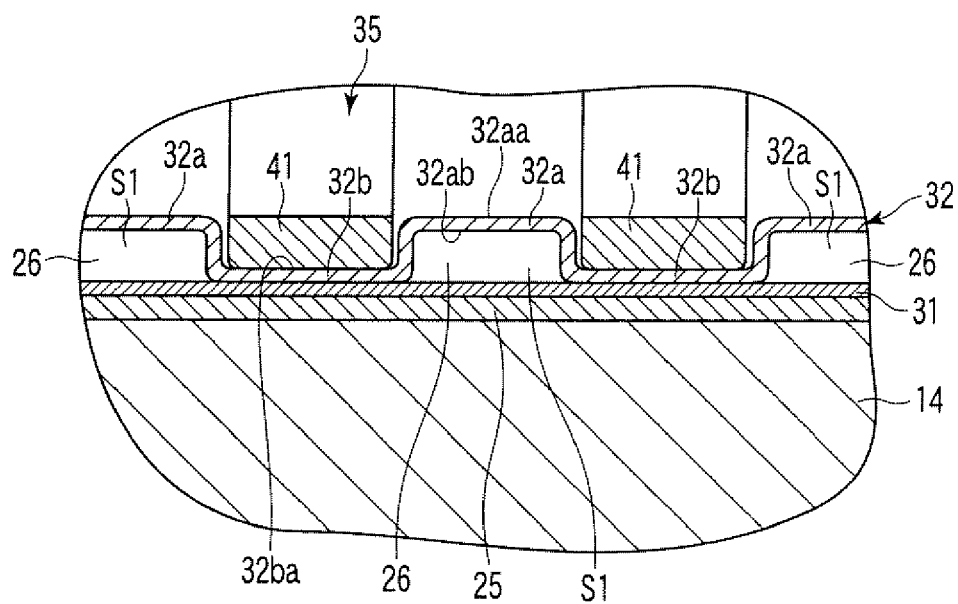
F I G. 8
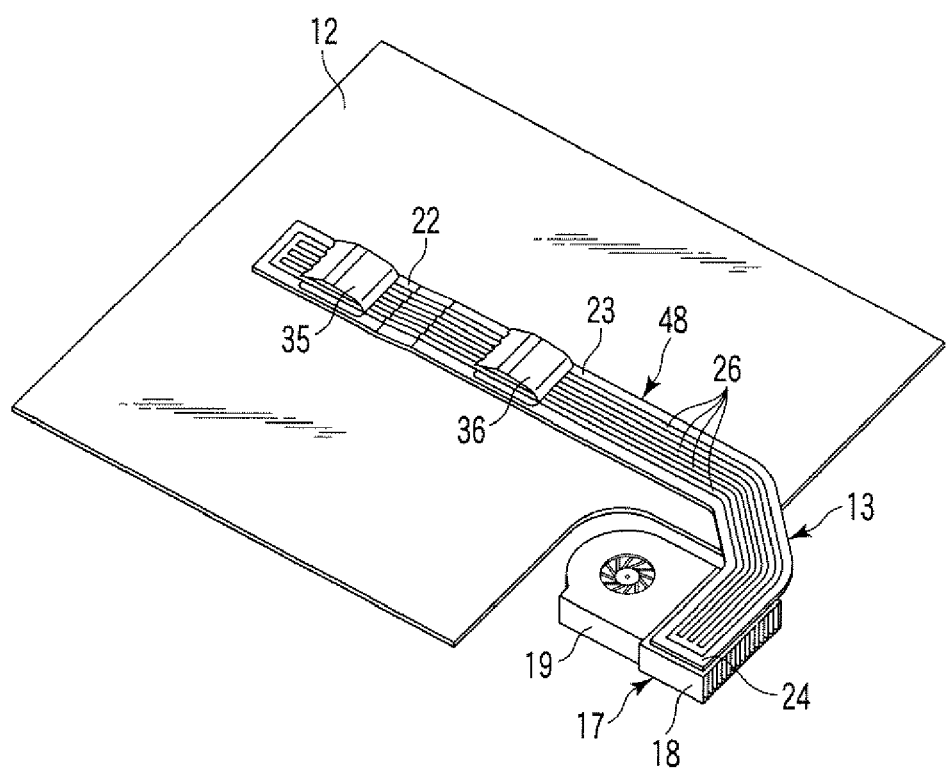
F I G. 9

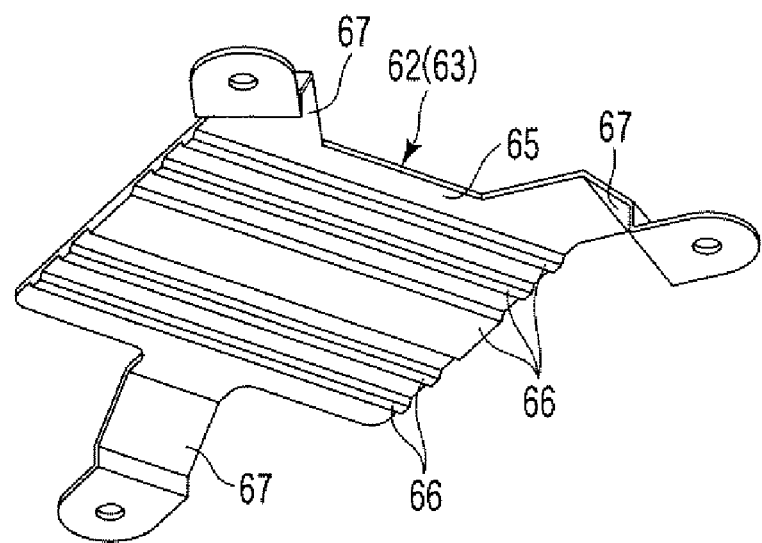
F I G. 12
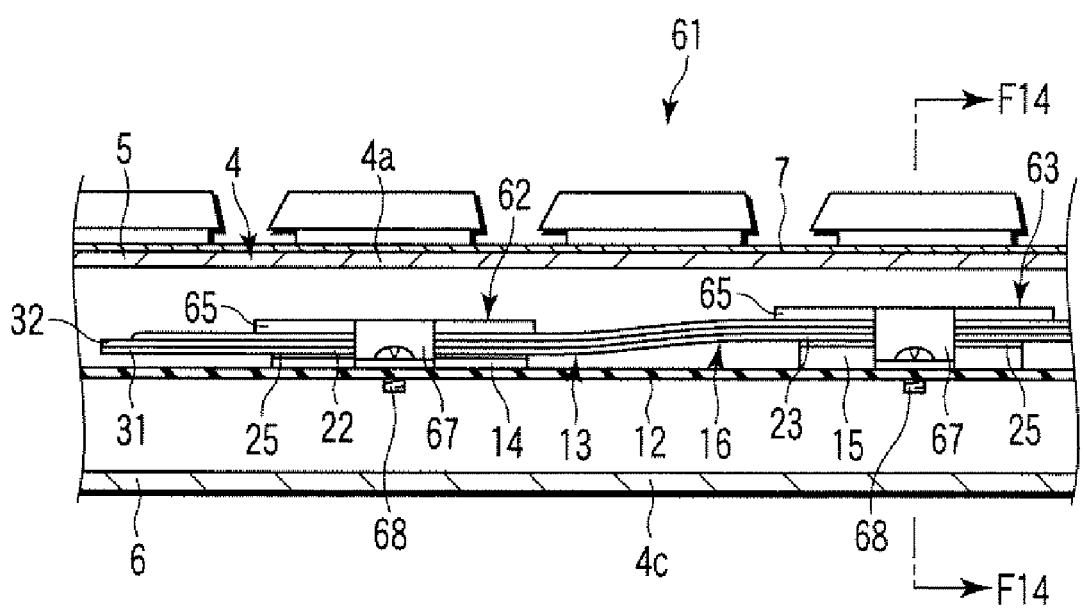
F I G. 13

ELECTRONIC DEVICE

CROSS-REFERENCE TO RELATED APPLICATIONS

This application is based upon and claims the benefit of priority from Japanese Patent Application No. 2006-320374, filed Nov. 28, 2006, the entire contents of which are incorporated herein by reference.

BACKGROUND

1. Field

One embodiment of the invention relates to an electronic device with a heat transfer unit including passages formed therein.

2. Description of the Related Art

An electronic device, for example, a portable computer, is frequently provided with a heat radiating structure for facilitating the cooling of a heat generating component mounted in the case. Jpn. Pat. Appln. KOKAI Publication No. 2003-124413 discloses a cooling device for efficiently radiating heat generated from electronic component mounted on the circuit board. The cooling device has a plurality of heat pipes shaped flat, a heat receiving block, connected to first ends of those heat pipes, for receiving heat from those electronic components, and radiation fins connected to the second ends of those heat pipes. This electronic device have a block holder mounted on the heat receiving block. The block holder is fixed to the circuit board by means of screws. With the structure, the block holder presses the heat receiving block against the electronic component. In a state wherein the heat receiving block is pressed against the electronic component, the heat generated from the electronic component is efficiently transferred to the heat receiving block.

The amount of heat generated from the circuit component mounted in the case increases year by year. It has been desired that the circuit component such as a graphics chip or memory is cooled together with a CPU. Generally, those circuit components, when mounted, are different in height.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 5 is an exemplary perspective view showing a pressing member according to the first embodiment;

FIG. 8 is an exemplary enlarged cross-sectional view showing a portion of a pressing member enclosed by a circle F8 in FIG. 7;

FIG. 9 is an exemplary perspective view showing a modification of the heat transfer unit according to the first embodiment;

FIG. 12 is an exemplary perspective view showing the pressing member shown in FIG. 11 when viewed from another angle;

FIG. 13 is an exemplary cross-sectional view showing a portable computer according to the third embodiment;

DETAILED DESCRIPTION

Various embodiments according to the invention will be described hereinafter with reference to the accompanying drawings. In general, according to one embodiment of the invention, an electronic device is provided with a heat transfer unit and a pressing member. The heat transfer unit includes a heat receiving portion thermally connected to a heat generating component, a heat radiating section thermally connected to a heat radiating part, and a plurality of passages through which fluid flows. The heat transfer unit includes first and second members being flexible and mutually bonded. The second member includes a plurality of passage parts which form spaces to be the passages between the first member and the second member, and a flat part being located between the adjacent passage parts and in contact with the first member. The pressing member presses the flat part toward the heat generating component, avoiding the plurality of passage parts.

Embodiments of the present invention will be described with reference to the accompanying drawings applied to a portable computer.

Figure 1:
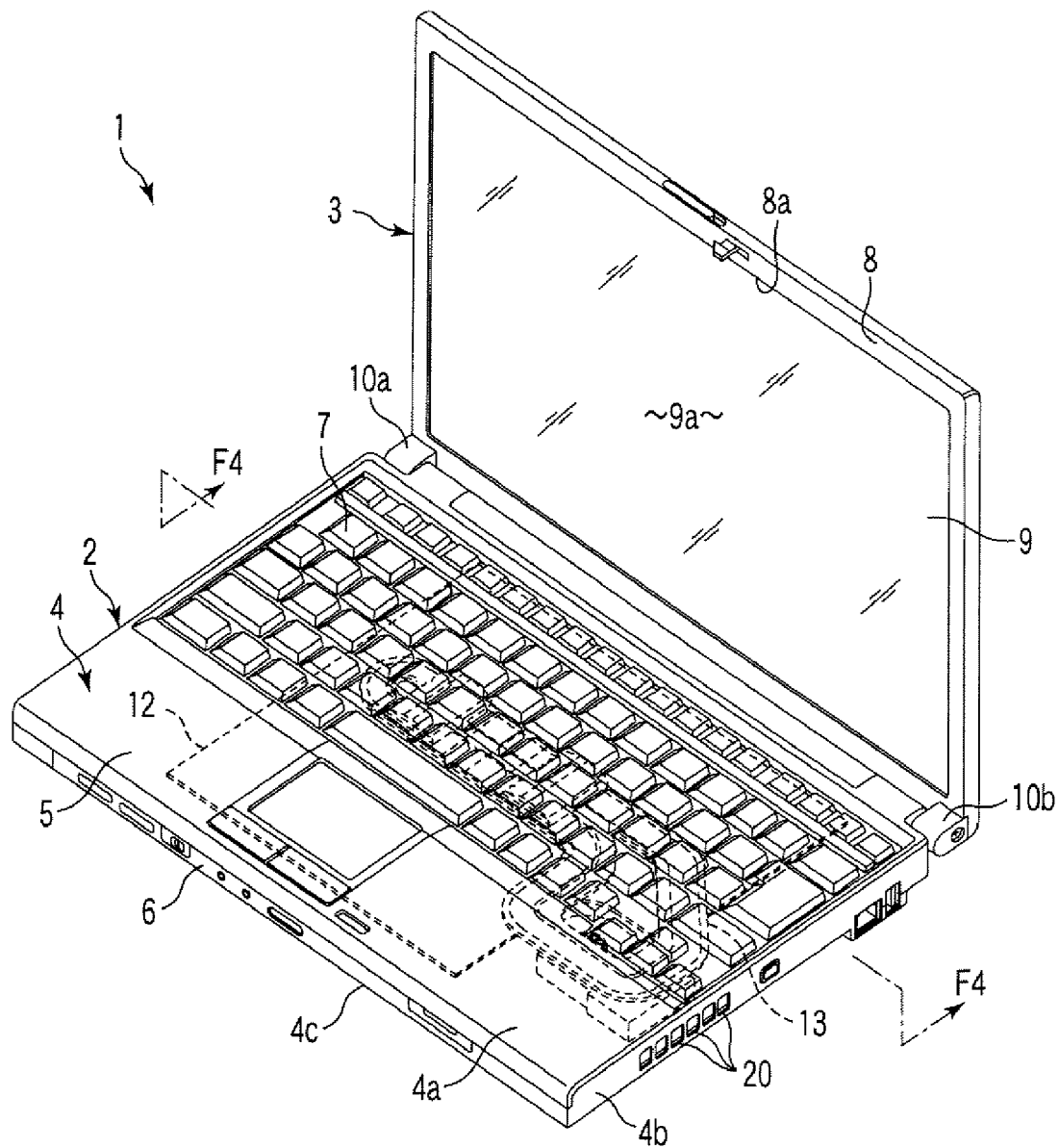
FIG. 1 is an exemplary perspective view showing a portable computer according to a first embodiment of the present invention.

FIGS. 1 to 8 show a portable computer 1 as one form of an electronic device according to a first embodiment of the present invention. As shown in FIG. 1, the portable computer 1 is provided with a main body 2 and a display unit 3.

The main body 2 includes a case 4 formed like a box. The case 4 includes an upper wall 4a, a peripheral wall 4b and a lower wall 4c. The case 4 has a case cover 5 including the upper wall 4a and a case base 6 including the lower wall 4c. The case cover 5 is detachably assembled to the case base 6 from above. The upper wall 4a supports a keyboard 7.

The display unit 3 includes a display housing 8 and a liquid crystal display (LOD) module 9 accommodated in the display housing 8. The LCD module 9 includes a display screen 9a. The display screen 9a is exposed to the outside of the display housing 8 through a front opening part 8a of the display housing 8.

The display unit 3 is supported at the end part of the case 4 with the aid of a pair of hinges 10a and 10b. With the structure, the display unit 3 may be turned from a close position to which it is turned down from above to cover the upper wall 4a to an open position to which it is turned upward and vice versa, and when it is at the open position, the upper wall 4a is exposed to outside.

Figure 2:
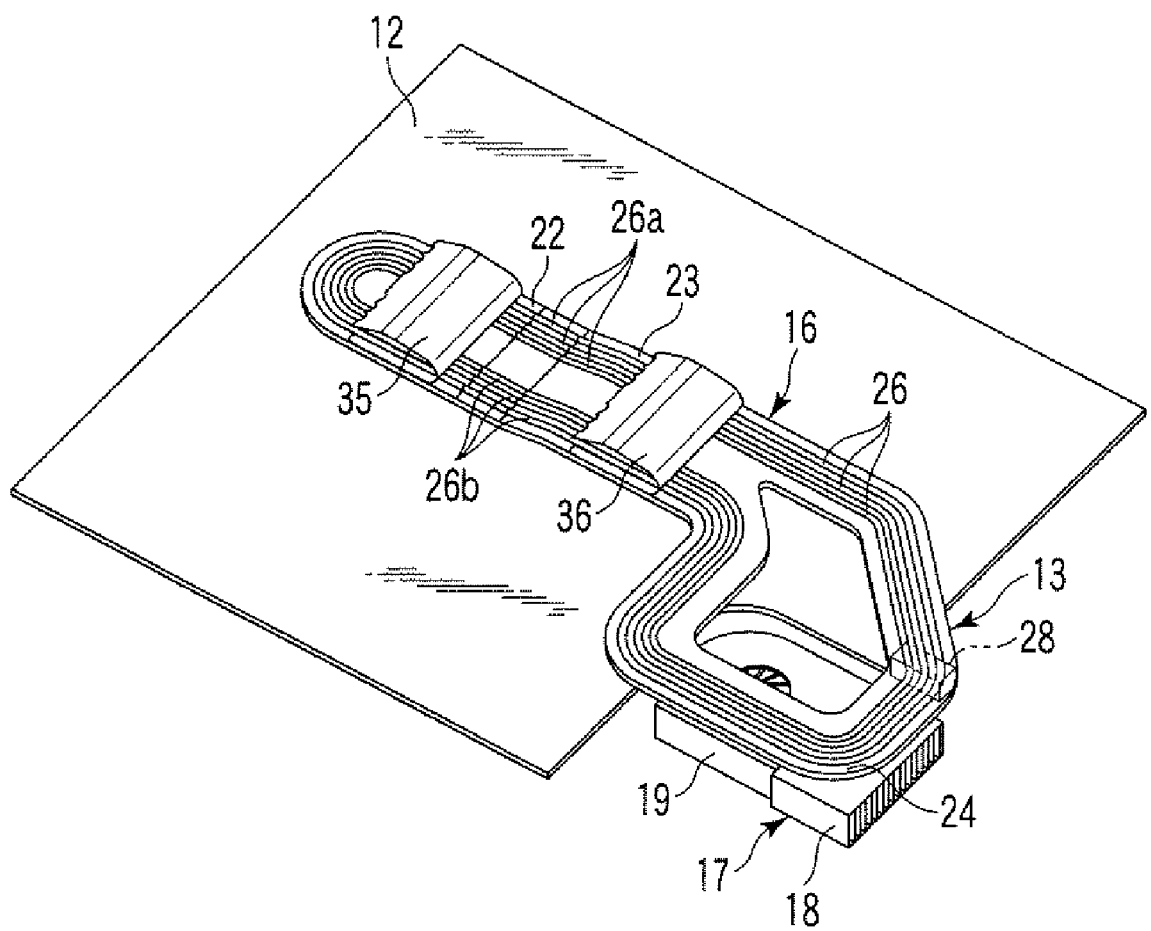
FIG. 2 is an exemplary perspective view showing a cooling device according to the first embodiment.
Figure 3:
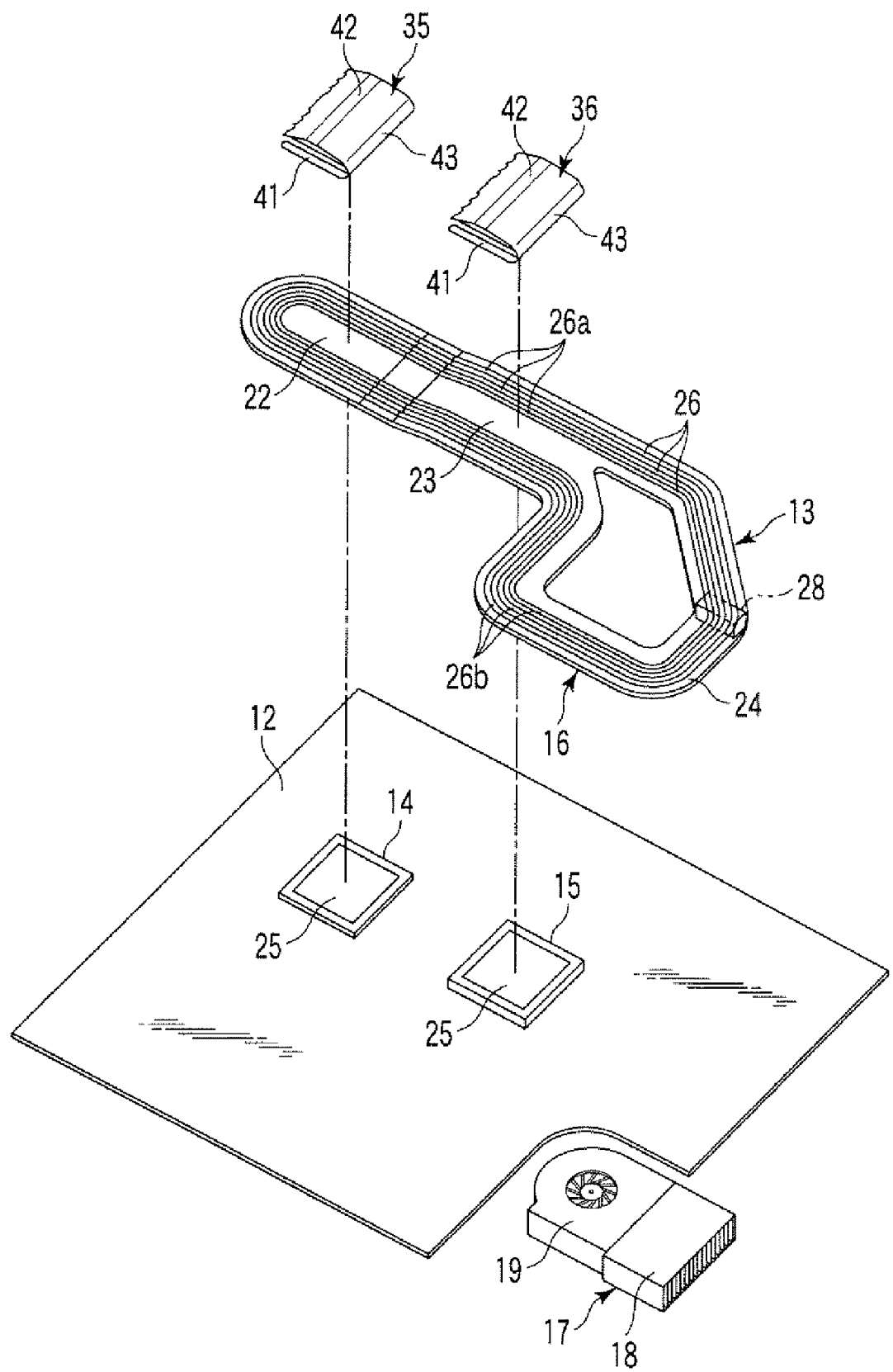
FIG. 3 is an exemplary exploded perspective view showing the cooling device according to the first embodiment.

As shown in FIGS. 1 and 2, the case 4 of the main body 2 contains a circuit board 12 and a cooling device 13. As shown in FIG. 3, first and second heat generating components 14 and 15, which generate heat when the computer is operating, are mounted on the circuit board 12. Each of those heat generating components 14 and 15 may take the form of a CPU, a graphics chip, a north bridge (trademark), a memory or a power source, for example. It is evident that the heat generating component to which the embodiment of the invention is applicable is not limited to the above ones, but may be any types of electronic components for which it is desirable to eliminate heat.

Figure 4:
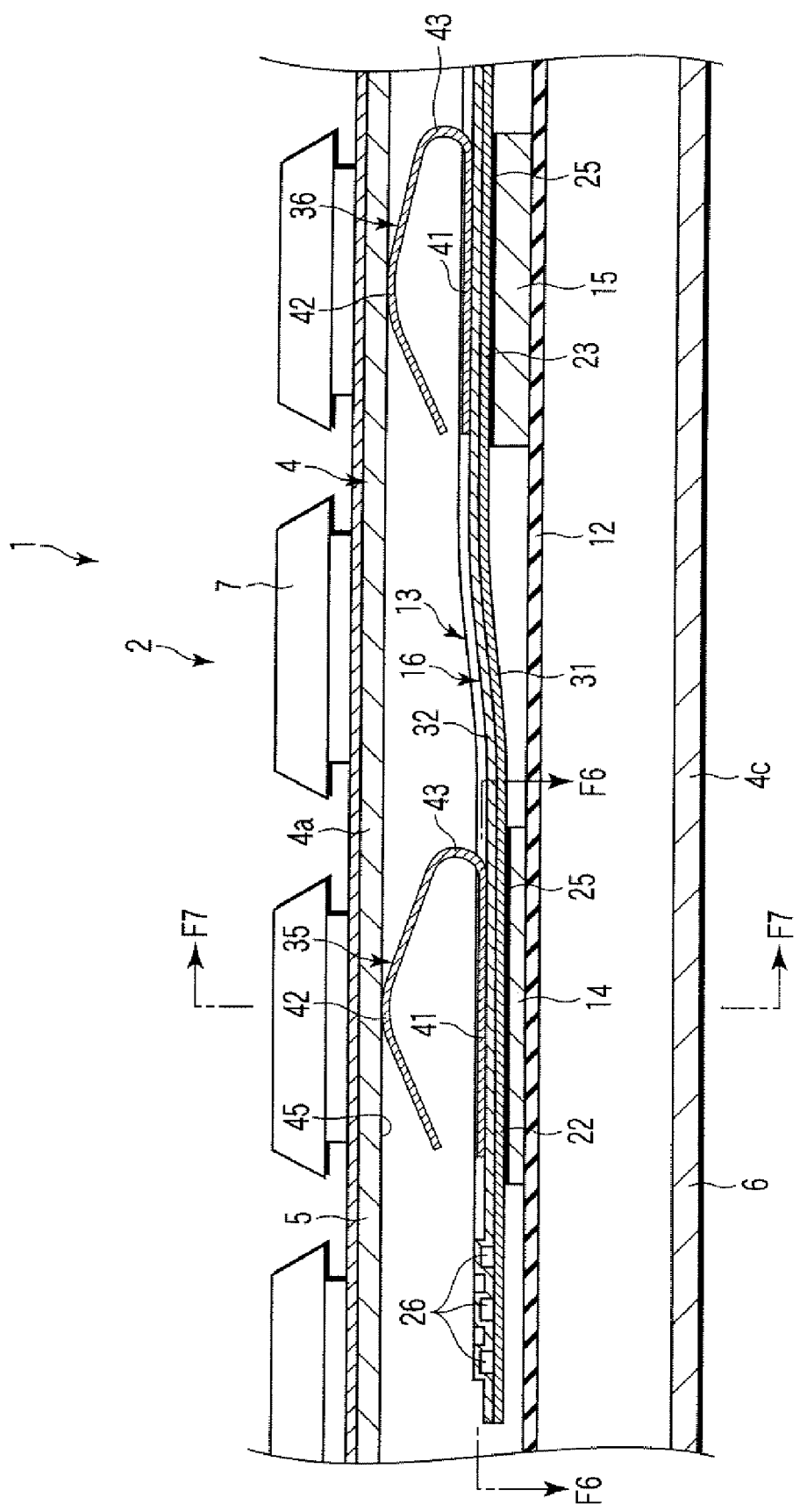
FIG. 4 is an exemplary cross-sectional view showing the portable computer shown in FIG. 1, taken along line F4-F4.

As shown in FIG. 4, the first and second heat generating components 14 and 15 are different in mounting height. In the present specification, "mounting height" means a height of the upper end or the lower end of the heat generating component when measured from the surface of the circuit board 12. In this embodiment, the mounting height of the second heat generating component 15 is greater than that of the first heat generating component 14.

As shown in FIG. 2, the cooling device 13 includes a heat transfer unit 16 and a heat radiating part 17. The heat radiating part 17 includes heat radiation fins 18 and a forced convection fan 19. Exhaust ports 20 are opened in the peripheral wall 4b of the case 4 (see FIG. 1). The heat radiation fins 18 are located in opposition to the exhaust ports 20. The forced convection fan 19 is located in opposition to the heat radiation fins 18 to cool the heat radiation fins 18.

As shown in FIG. 3, the portable computer 1 according to the present embodiment employs the heat transfer unit 16 of the circulation type having looped passages as an example of the heat transfer unit of the present invention. The heat transfer unit 16 has such a size that it ranges from the first and second heat generating components 14 and 15 to the heat radiation fins 18. The heat transfer unit 16 includes a first heat receiving section 22, a second heat receiving section 23 and a heat radiating section 24.

The first heat receiving section 22 is opposed to the first heat generating component 14. The first heat receiving section 22 is mounted on the first heat generating component 14 to be thermally connected to the first heat generating component 14. The second heat receiving section 23 is opposed to the second heat generating component 15. The second heat receiving section 23 is mounted on the second heat generating component 15 to be thermally connected to the second heat generating component 15.

The heat radiating section 24 is opposed to the heat radiation fins 18. The heat radiation fins 18 are mounted on the heat radiating section 24. The heat radiating section 24 is thermally connected to the heat radiation fins 18. Heat transfer members 25 are interposed between the first heat receiving section 22 and the first heat generating component 14 and between the second heat receiving section 23 and the second heat generating component 15. The heat transfer member 25 is made of, for example, a heat transfer sheet or grease, and enhances heat transfer property between adjacent members.

The heat transfer unit 16 has a plurality of passages 26 through which fluid circulatingly flows. The passages 26 extend between the first and second heat receiving parts 22 and 23 and the heat radiating section 24. The passages 26 are formed in the heat transfer unit 16 and liquid-tightly closed. Liquid refrigerant such as water, alcohol, ammonia, Freon, or alternative Freon is sealed in the passages 26.

Each passage 26 includes a forward passage section 26b through which the fluid flows from the heat radiating section 24 to the first and second heat receiving sections 22 and 23, and a return passage section 26b through which the fluid flows from the first and second heat receiving sections 22 and 23 to the heat radiating section 24. Specifically, the fluid which flows through the forward passage 26 extending from the heat radiating section 24 first flows through the second heat receiving section 23 and then the first heat receiving section 22. The fluid that leaves the first heat receiving section 22 enters the return passage section 26b. The fluid having entered the return passage section 26b flows through the first heat receiving section 22 and the second heat receiving section 23, and returns to the heat radiating section 24. Then, the fluid having reached the return passage section 26b enters again the forward passage section 26b.

Thus, the first and second heat receiving sections 22 and 23 each contain both the forward passage section 26b and the return passage section 26b. The heat transfer unit 16 includes, for example, a pump 28 for forcibly circulating the liquid refrigerant along the passage 26. The heat transfer unit 16 may be of the natural circulation type in which the liquid refrigerant circulates naturally, without aid of the pump 28.

Figure 7:
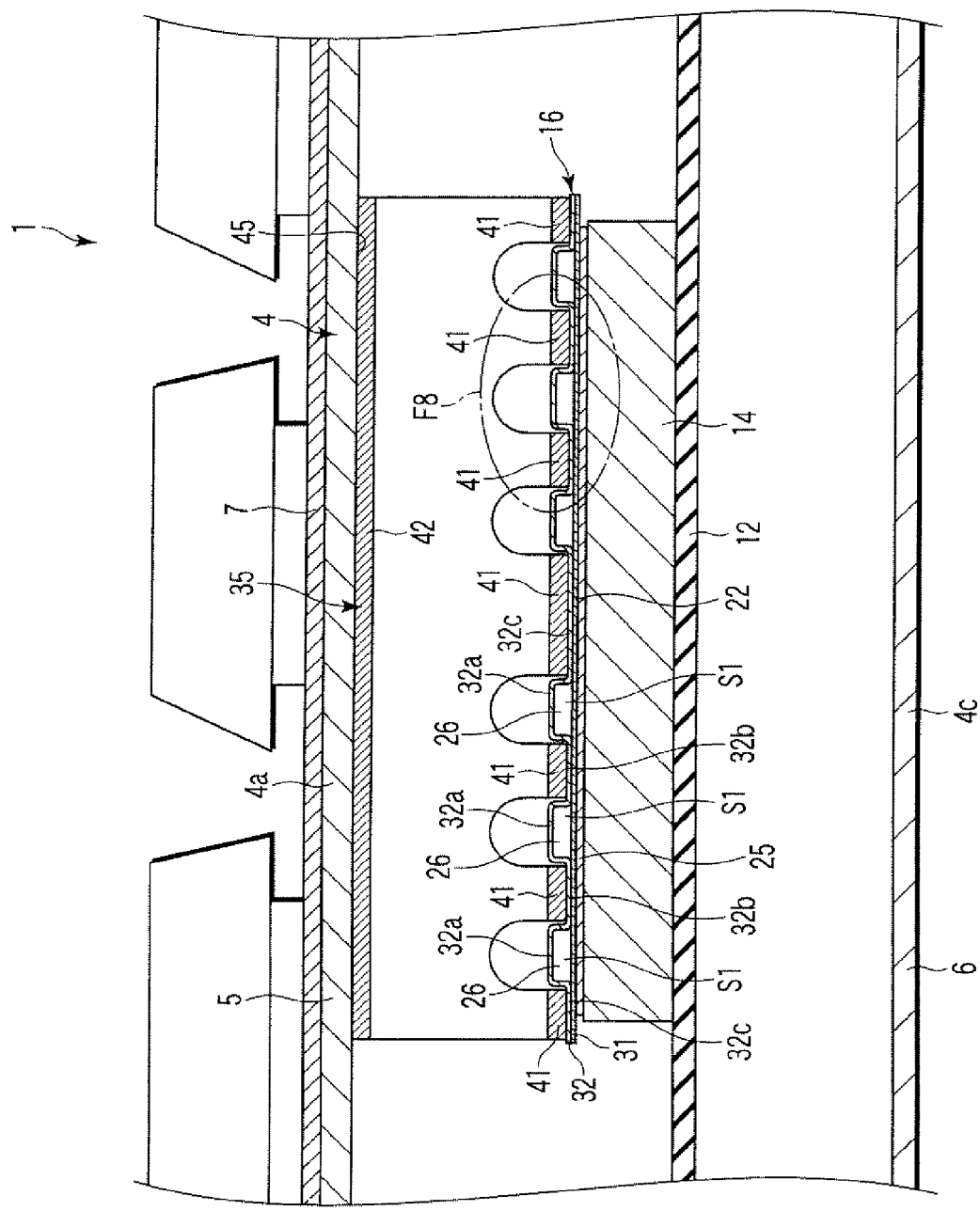
FIG. 7 is an exemplary cross-sectional view showing the pressing member shown in FIG. 4, taken along line F7-F7.

As shown in FIG. 7, the heat transfer unit 16 includes, for example, first and second members 31 and 32. The first and second members 31 and 32 are flexible, thin plate members. The first and second members 31 and 32 are formed with copper plate members, for example. The copper plate member has good thermal conductivity in comparison with other materials and compatible with the liquid refrigerant. The material of the first and second members 31 and 32 is not limited to copper, as a matter of course.

The first and second members 31 and 32 are mutually bonded. The first and second members 31 and 32 are each a thin member of 0.1 to 0.5 mm thick. The modulus of elasticity of the heat transfer unit 16 is 20000 or smaller, and the heat transfer unit 16 has a relatively great flexibility. As shown in FIG. 4, the heat transfer unit 16 is bent by an amount corresponding to a difference between the mounting heights of the first heat generating component 14 and the second heat generating component 15.

A shape of the first member 31 is substantially the same as that of the heat transfer unit 16 when viewed from above. The first member 31 is entirely flat, for example. As shown in FIG. 7, the first member 31 is located in opposition to the first and second heat generating components 14 and 15.

A shape of the second member 32 is substantially the same as that of the first member 31 when viewed from above. As shown in FIG. 7, the second member 32 has recessed parts, worked by embossing or extrusion processing. Specifically, the second member 32 includes passage parts 32a and flat parts 32b, which are alternatively arranged in the direction orthogonal to the passages 26.

The number of the passage parts 32a corresponds to that of the passages 26. Each passage part 32a is recessed away from the first member 31, and a space S1 is formed between the passage part 32a and the first member 31. When the first and second members 31 and 32 are bonded each other, the space S1 functions as the passage 26. Each flat part 32b is located between the adjacent passage parts 32a. The flat parts 32b are mounted on and in contact with the first member 31. The second member 32 is uniform in thickness. The passage parts 32a are raised from respective edges of the flat parts 32b in a direction away from the first member 31 to form spaces S1 in cooperation with the first member 31.

The heat transfer unit 16 additionally includes other flat parts 32c in the area between the forward passage section 26b and the return passage section 26*b* of the passages 26, and a peripheral edge part of the heat transfer unit 16 located out of the passages 26. The flat parts 32*c* are in contact with the first member 31, like the flat parts 32*b*. The flat parts 32*b* and the flat parts 32*c* of the second member 32 are joined to the first member 31 by welding, bonding or curling. The first and second members 31 and 32 are coupled together into a unit.

As shown in FIGS. 3 and 4, the portable computer 1 has pressing members 35 and 36 for pressing the heat transfer unit 16 against the first and second heat generating components 14 and 15. The number of those pressing members 35 and 36 correspond to that of the heat generating components 14 and 15, for example. The present embodiment includes the first pressing member 35 to be mounted on the first heat receiving section 22 of the heat transfer unit 16, and the second pressing member 36 to be mounted on the second heat receiving section 23. The first and second pressing members 35 and 36 are opposed to the heat transfer unit 16 from the side opposite to the first and second heat generating components 14 and 15.

Figure 6:
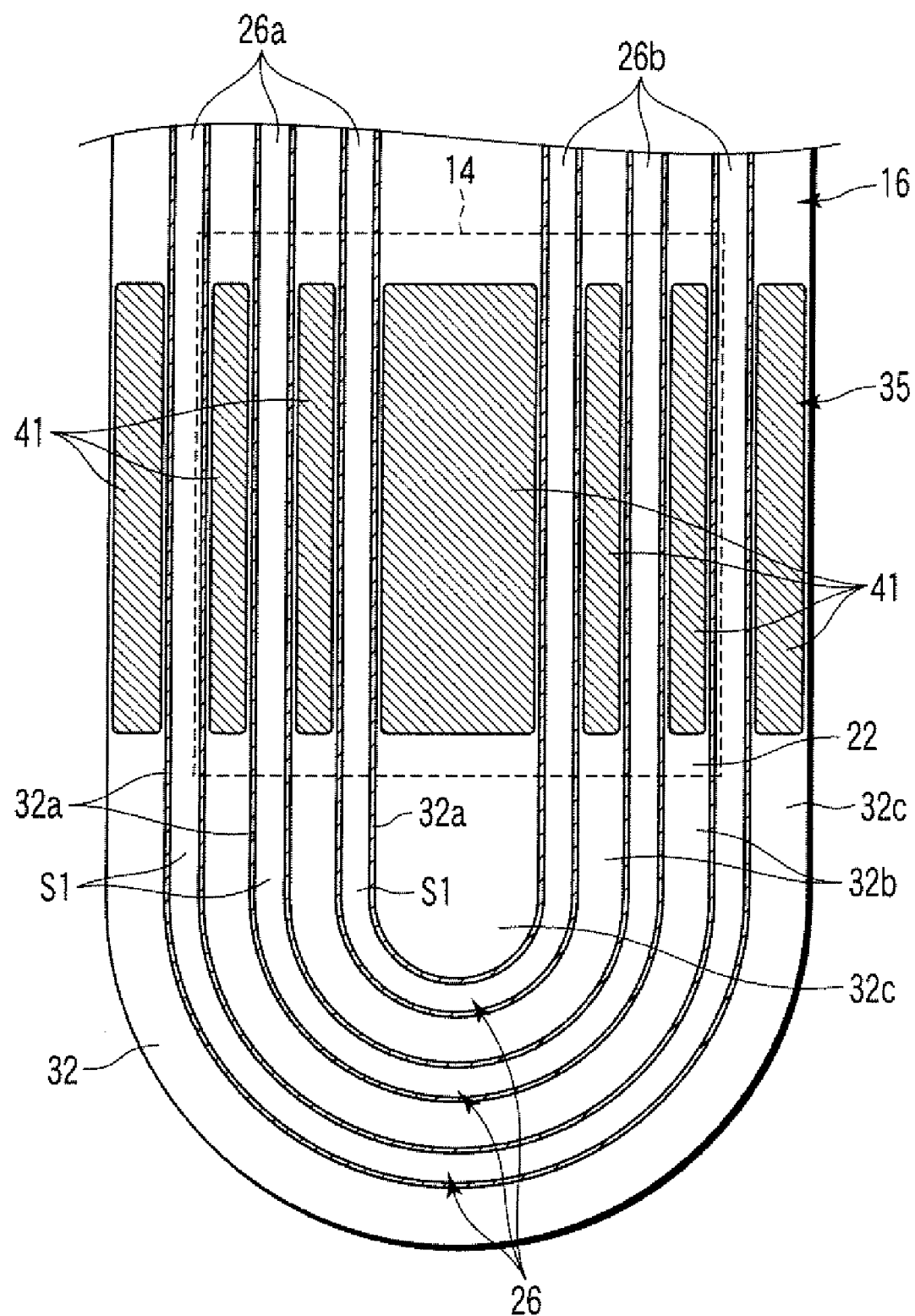
FIG. 6 is an exemplary cross-sectional view showing the pressing member shown in FIG. 4, taken along line F6-F6.

As shown in FIG. 5, the first pressing member 35 is a spring member having a U-shaped longitudinal cross-section. As shown in FIG. 6, the transversal width of the first pressing member 35 is substantially equal to that of the heat transfer unit 16. As shown in FIG. 4, the first pressing member 35 includes first and second contact portions 41 and 42, and a bending portion 43. The bending portion 43 is located between the first and second contact portions 41 and 42. When a distance between the first and second contact portions 41 and 42 becomes narrower than the original distance, the bending portion 43 generates such a force as to move the first and second contact portions 41 and 42 apart from each other. The bending portion 43 extends over the full width of the first pressing member 35 and entirely covers the plurality of passage parts 32*a* of the heat transfer unit 16. The bending portion 43 is one form of a main body of the pressing member in the present invention.

For example, the first pressing member has a plurality of the first contact portions 41. The first contact portions 41 protrude from an end of the bending portion 43 toward the second member 32 of the heat transfer unit 16, and are in contact with the second member 32. As shown in FIGS. 7 and 8, some of the first contact portions 41 are mounted between the adjacent raised passage parts 32*a* and in contact with the flat part 32*b* located between those raised passage parts 32*a*. The other first contact portions 41 are in contact with the flat parts 32*c* located between the forward passage section 26*b* and the return passage section 26*b* and the flat parts 32*c* located at the peripheral edge part of the heat transfer unit 16.

As shown in FIG. 6, the majority of each first contact portion 41 is flat in conformity with the shape of the flat part 32*b* or 32*c*. Accordingly, the majority of each first contact portion 41 is in contact with flat part 32*b* or 32*c* formed in the first heat receiving section 22.

As shown in FIG. 4, the case 4 has an inner wall 45, which is facing the heat transfer unit 16. The second contact portion 42 of the first pressing member 35 extends toward the inner wall 45 of the case 4, from the other end of the bending portion 43. The second contact portion 42 extends over the full width of the first pressing member 35, for example.

The second contact portion 42 contacts at the center with the inner wall 45 and the tip of the second contact portion 42 bends toward the inner side of the case 4. With such a configuration, the center of the second contact portion 42 contacts with the inner wall 45 irrespective of the degree of elastic deformation of the first pressing member 35. In other words, even in a state wherein the first pressing member 35 is deformed by compression, the majority of each first contact portion 41 is always mounted on and along the heat transfer unit 16.

The first contact portions 41 of the first pressing member 35 are secured to the heat transfer unit 16 by means of double-coated adhesive tapes, for example. The first contact portions 41 may be fixed to the heat transfer unit 16 by spot welding, for example.

The first pressing member 35 has elasticity and held by compression between the inner wall 45 of the case 4 and the heat transfer unit 16. The first pressing member 35 presses the flat parts 32*b* and 32*c* of the heat transfer unit 16, which are in contact with the first contact portions 41, toward the first heat generating component 14. In other words, the first pressing member 35 is not in contact with the passage parts 32*a*, and presses the area of the heat transfer unit 16, which is located out of the passage parts 32*a*, avoiding said plurality of passage parts 32*a*.

A basic construction of the second pressing member 36, which is the same as that of the first pressing member 35, includes first and second contact portions 41 and 42, and a bending portion 43. The second pressing member 36 is different from the first pressing member 35 in the spring characteristic, for example. The second pressing member 36 may have the same spring characteristic as that of the first pressing member 35. The first contact portions 41 of the second pressing member 36 are in contact with the flat parts 32*b* and 32*c* located in the second heat receiving section 23.

The second pressing member 36 has elasticity and is held by compression between the inner wall 45 of the case 4 and the heat transfer unit 16. With this, the second pressing member 36 presses the flat parts 32*b* and 32*c* of the heat transfer unit 16, which are in contact with the first contact portions 41, toward the second heat generating component 15. In other words, the second pressing member 36 is not in contact with the passage parts 32*a*, and presses the area of the heat transfer unit 16, which is located out of the passage parts 32*a*, avoiding said plurality of passage parts 32*a*. The second pressing member 36 is supported on the inner wall 45 on which the first pressing member 35 is supported.

How to assemble the portable computer 1 will now be described hereunder.

Before the case cover 5 is coupled to the case base 6, the circuit board 12 and the cooling device 13 are mounted on the case base 6. The first and second pressing members 35 and 36 are secured to the heat transfer unit 16 by means of double-coated adhesive tapes, for example. Following the mounting of those components, the case cover 5 is coupled to the case base 6. When the case cover 5 is coupled to the case base 6, the first and second pressing members 35 and 36 are compressed between the inner wall 45 of case cover 5 and the heat transfer unit 16. In this manner, the first and second pressing members 35 and 36 press the heat transfer unit 16 toward the first and second heat generating components 14 and 15.

The heat transfer unit 16 has flexibility and bends conforming to the mounting heights of the first and second heat generating components 14 and 15 under the pressure by the first and second pressing members 35 and 36 to thereby absorb the difference between the mounting heights of the first and second heat generating components 14 and 15. As a result of pressing the heat transfer unit 16 by the first and second pressing members 35 and 36, the first and second heat receiving sections 22 and 23 of the heat transfer unit 16 are closely coupled to the first and second heat generating components 14 and 15, with the heat transfer member 25 interposed therebetween. In an example, the spring characteristics of the first and second pressing members 35 and 36 are adjusted so that the first and second pressing members 35 and 36 apply proper designated loads to the first and second heat generating components 14 and 15 when those are compressed between the heat transfer unit 16 and the inner wall 45 of the case 4.

Functions of the portable computer 1 will be described below.

Most of heat generated by the first and second heat generating components 14 and 15 is transferred to the first and second heat receiving section 22 and 23 of the heat transfer unit 16 by way of the heat transfer member 25, respectively. The liquid refrigerant circulates through the passages 26 of the heat transfer unit 16 and the heat of the first and second heat receiving sections 22 and 23 is transferred to the heat radiating section 24. The heat having been transferred to the heat radiating section 24 is discharged to the outside of the case 4 by the heat radiation fins 16 and the forced convection fan 19.

In the portable computer 1 thus constructed, the heat transfer unit 16 is thermally coupled to the first and second heat generating components 14 and 15 more firmly. It is noted that the heat transfer unit 16 has the flat parts 32b, which are located out of the passages 26, and the first and second pressing members 35 and 36 press the flat parts 32b. Since the first and second pressing members 35 and 36 press the flat parts 32b, the heat transfer unit 16 is pressed without crushing the passages 26. Since the heat transfer unit 16 is pressed toward the heat generating components 14 and 15, it is possible to improve the efficiency of the heat transfer between the heat transfer unit 16 and the heat generating components 14 and 15. Accordingly, it is secured to thermally couple the first and second heat generating components 14 and 15 to the heat transfer unit 16, more firmly.

The second member 32 of the heat transfer unit 16 may be a structural member in which the passages 26 are formed by merely grooving a plate-like member. That is, the area of each flat part is thicker than the area of each passage part to thereby form a space S1 in cooperation with the first member 31. Where the passage parts 32a are raised from the flat parts 32b as in the embodiment, a surface 32ba of each flat parts 32b is located closer to the first member 31 than a surface 32aa of each passage parts 32a (FIG. 8).

Where the surfaces 32ba of the flat parts 32b are located close to the first member 31, when the flat parts 32b are pressed, the influence of the pressing of the flat parts 32b on the passage parts 32a is further lessened. In other words, a chance of crushing of the passages 26 is further lessened. Where the surface 32ba of the flat parts 32b is located closer to the first member 31 than a bottom surface 32ab of the space S1 (i.e., the wall surface located most away from the first member 31), a chance of crushing of the passages 26 when the flat parts 32b are pressed is further lessened.

Where the pressing members 35 and 36 according to the embodiment are used, there is less chance that the passages 26 of the heat transfer unit 16 are crushed. Therefore, a desired designated load can be applied to the heat transfer unit 16, with no failure of deformation of the heat transfer unit 16. This contributes to improvement of the heat transfer efficiency between the first and second heat generating components 14 and 15 and the heat transfer unit 16.

When the pressing members 35 and 36 according to the embodiment are used, it is allowed to use the heat transfer unit 16 having flexibility. Where the heat transfer unit 16 has flexibility, one heat transfer unit 16 may couple the heat generating components 14 and 15 having different mounting heights for the thermal connection. Accordingly, the cooling structure in the portable computer 1 is simplified, leading to size reduction of the portable computer 1.

In the case where the pressing members 35 and 36 are spring members compressed between the heat transfer unit 16 and the inner wall 45 of the case 4, there is no need of fixing the pressing members 35 and 36 to the case 4 or the circuit board 12, and hence, the fixing structure of the pressing members 35 and 36 is simplified. Parts used for fixing the pressing members 35 and 36, for example, screws, may be omitted for constructing the portable computer. The portable computer 1 thus needs a decreased number of parts for its construction.

When the pressing members 35 and 36 are used, there are no excessive parts interposed between the heat transfer unit 16 and the inner wall 45 of the case 4. This results in realizing the thinning of the portable computer 1. When the pressing members 35 and 36 for pressing the first and second heat generating components 14 and 15 having different mounting heights are both supported on one and the same inner wall 45 of the case 4, the fixing structure of the pressing members 35 and 36 is further simplified.

A modification of the present embodiment will be described with reference to FIG. 9. The portable computer 1 of the modification uses a heat transfer unit 48 in place of the heat transfer unit 16. The heat transfer unit 48 is of a reciprocative circulation type. The passages 26 of the heat transfer unit 48 are closed at both ends. Heat from the heat receiving sections 22 and 23 is transferred to the heat radiating section 24 through the reciprocative movement of the fluid between the heat receiving sections 22 and 23 and the heat radiating section 24.

The heat transfer unit 48 may be a heat pipe type in which the working fluid is repeatedly condensed and evaporated for heat transfer. The heat transfer unit 48 is substantially the same as the heat transfer unit 16 in the basic construction except the fluid circulation method. The portable computer 1 using the heat transfer unit 48 also produces useful effects comparable with those produced when it uses the heat transfer unit 16.

Figure 10:
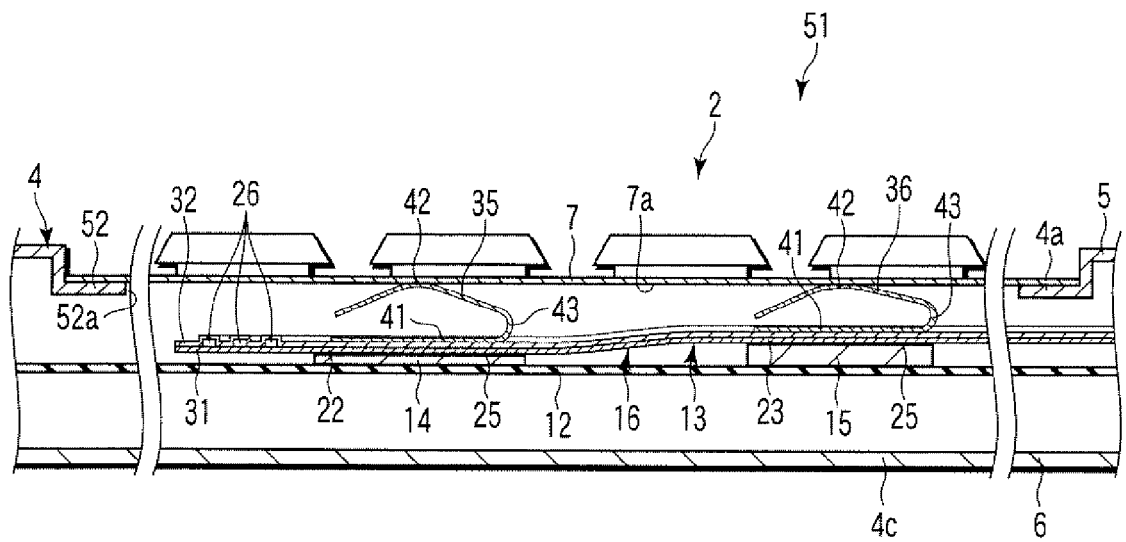
FIG. 10 is an exemplary cross-sectional view showing a portable computer according to a second embodiment of the present invention.
Figure 11:
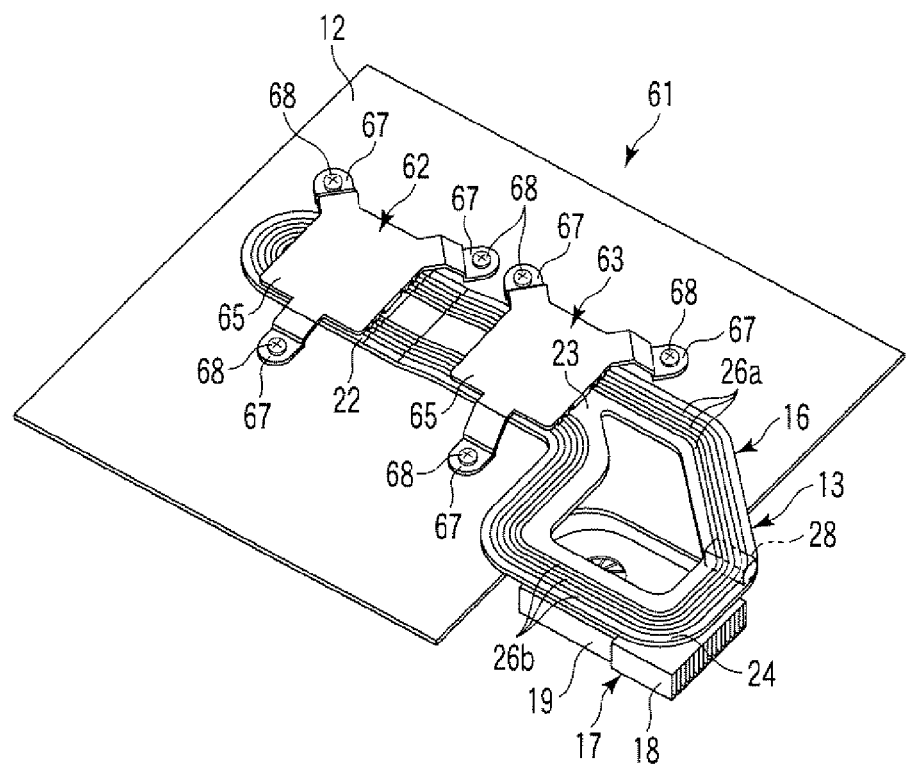
FIG. 11 is an exemplary perspective view showing a pressing member according to a third embodiment of the present invention.

A portable computer 51 as an electronic device according to a second embodiment of the present invention will be described with reference to FIG. 10. In the second embodiment, like or equivalent portions are designated by like reference numerals in the first embodiment. The portable computer 51 is substantially the same as that of the first embodiment in the basic construction.

In the portable computer 51, a keyboard mounting part 52 is formed in the upper wall 4a of the case 4. A keyboard 7 is mounted on the keyboard mounting part 52. An opening 52a opened into the case 4 is formed in the keyboard mounting part 52. The opening 52a faces the first and second heat generating components 14 and 15 of the heat transfer unit 16. A bottom surface 7a of the keyboard 7 mounted on the keyboard mounting part 52 is exposed to the inside of the case 4 through the opening 52a. The pressing members 35 and 36 are compressively held between the heat transfer unit 16 and the bottom surface 7a of the keyboard 7 through the opening 52a.

In the portable computer 51 thus constructed, the thermal connection of the heat transfer unit 16 to the heat generating components 14 and 15 is firmer. The pressing members 35 and 36 of the embodiment applies desired designated loads to the heat transfer unit 16, with less failure of crushing the passages 26. As a result, the efficiency of the heat transfer between the heat transfer unit 16 and the heat generating components 14 and 15 is improved.

In the case where the pressing members 35 and 36 are spring members compressed between heat transfer unit 16 and the bottom surface 7a of the keyboard 7, there is no need of fixing the pressing members 35 and 36 to the case 4 or the circuit board 12, and hence, the fixing structure of the pressing members 35 and 36 is simplified.

A portable computer 61 as an electronic device according to a third embodiment of the present invention will be described with reference to FIGS. 11 to 15. In the embodiment, like or equivalent portions are designated by like reference numerals in the first embodiment. The portable computer 61 is substantially the same as that of the first embodiment in the basic construction, except that configurations of first and second pressing members 62 and 63 are different from those of the pressing members 35 and 36.

Figure 14:
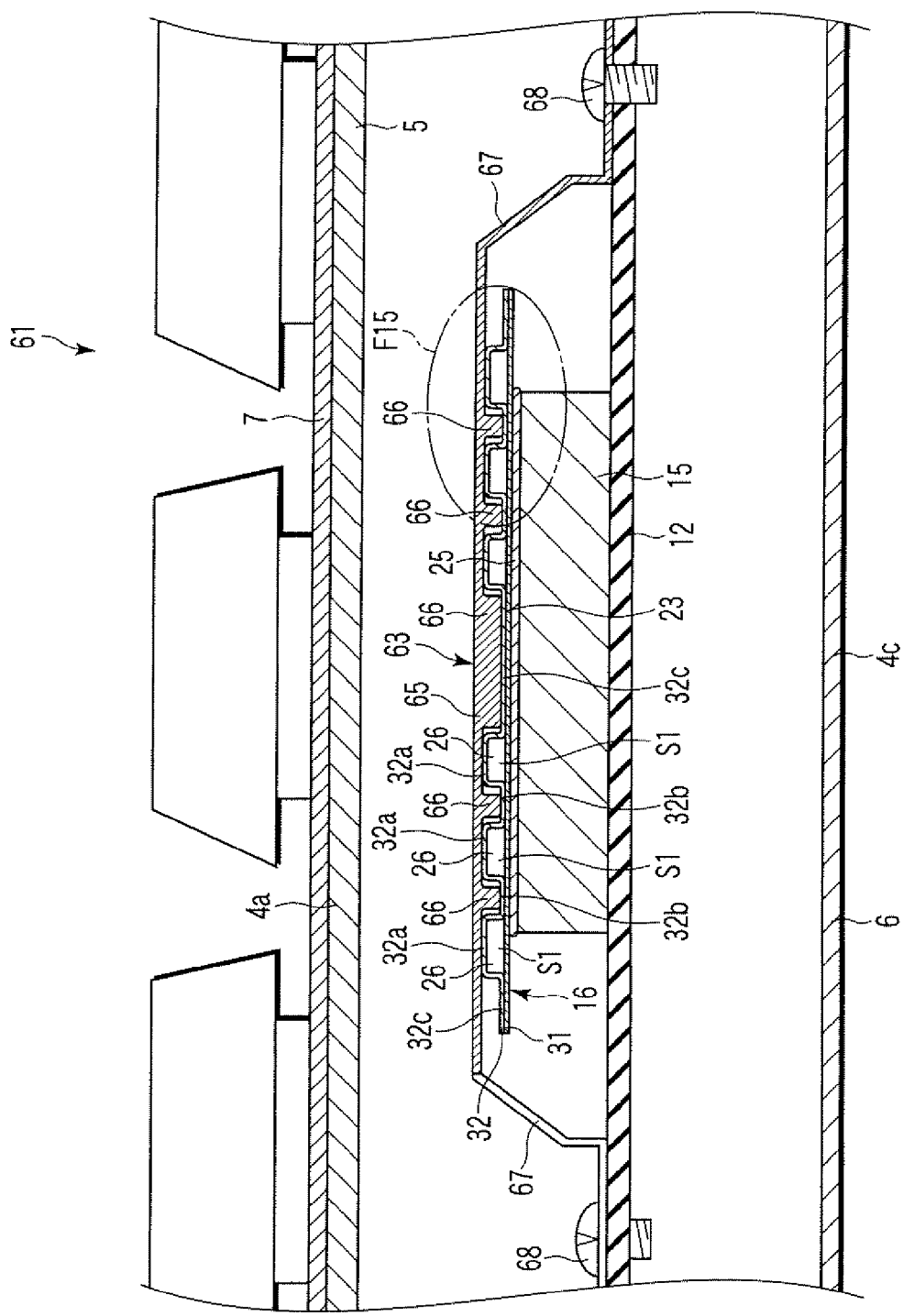
FIG. 14 is an exemplary cross-sectional view showing the portable computer shown in FIG. 13, taken along line F14-F14.

As shown in FIGS. 12 and 14, each of the first and second pressing members 62 and 63 includes a main body 65, contact portions 66 and legs 67. The main body 65, shaped like a plate, is opposed to the heat transfer unit 16. The main body 65 integrally covers the plurality of passage parts 32a of the heat transfer unit 16. The contact portions 66 are formed in the areas of the main body 65, which are located to be opposed to the flat parts 32b and 32c. The contact portions 66 extend to the flat parts 32b and 32c. The contact portions 66 are inserted between the adjacent raised passage parts 32a, while being in contact with the flat parts 32b.

The contact portions 66 extend from one end to the other end of the main body 65 along the flat parts 32b. Accordingly, the contact portion 66 comes in contact with the majority of each flat part 32b formed in the first or second heat receiving sections 22 or 23.

Three legs 67, for example, are extended outward from the peripheral edge of the main body 65, while being curved somewhat downward to the circuit board 12. The tip ends of the legs 67 reach the circuit board 12, and are fixed to the circuit board 12 by means of screws 68, for example. The legs 67 are fixed to the circuit board 12, so that the first and second pressing members 62 and 63 are fixed in the case 4. In each of the first and second pressing members 62 and 63, the legs 67 are different in length in accordance with the mounting heights of the first and second heat generating components 14 and 15.

Figure 15:
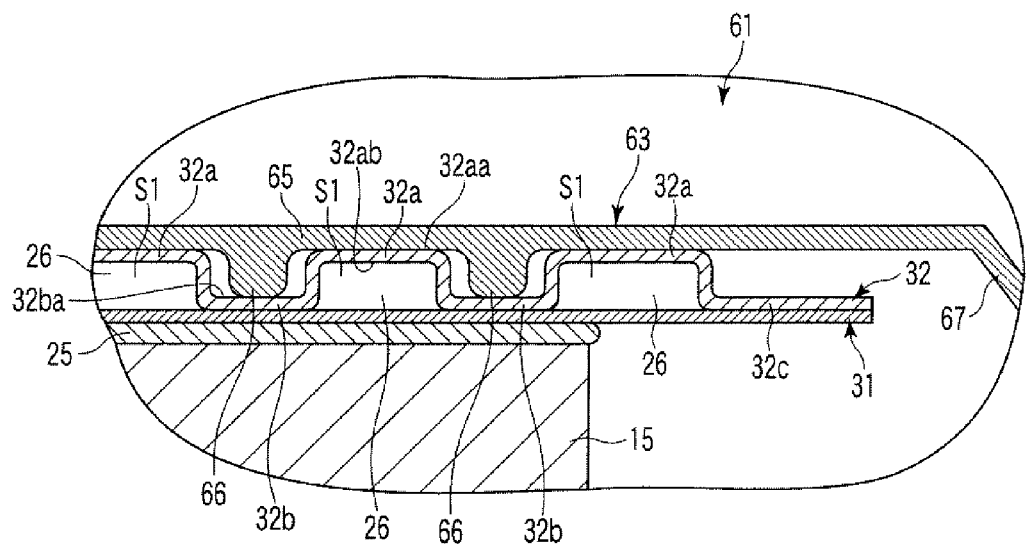
FIG. 15 is an exemplary enlarged cross-sectional view showing a portion of the pressing member enclosed by a circle F15 in FIG. 14.

The first and second pressing members 62 and 63 have elasticity. By fixing the legs 67 to the circuit board 12, a force having a direction toward the heat transfer unit 16 acts on the main body 65. When a force directed toward the heat transfer unit 16 acts on the main body 65, the contact portions 66 apply forces, which have direction toward the heat generating components 14 and 15, to the heat transfer unit 16. As shown in FIG. 15, each of the first and second pressing members 62 and 63 presses against the heat generating components 14 and 15 the flat parts 32b each between the adjacent passage parts 32a, which are located out of the plurality of passage parts 32a, avoiding said plurality of passage parts 32a.

In the portable computer 61 thus constructed, the heat transfer unit 16 can be thermally coupled to the first and second heat generating components 14 and 15 more firmly. The pressing members 62 and 63 of present the embodiment applies desired designated loads to the heat transfer unit 16, with less failure of crushing the passages 26. As a result, the efficiency of the heat transfer between the heat transfer unit 16 and the heat generating components 14 and 15 is improved.

When the pressing members 62 and 63 according to the embodiment are used, it is allowed to use the heat transfer unit 16 having flexibility. The heat generating components 14 and 15 having different mounting heights may be coupled together by one heat transfer unit 16 having flexibility for the thermal connection. Accordingly, the cooling structure in the portable computer 61 can be simplified, leading to size reduction of the portable computer 61.

Further, the pressing members 62 and 63 of the present embodiment may be applied to the plurality of heat generating components 14 and 15 having different mounting heights by merely adjusting the lengths of the legs 67. The heat transfer unit 16 may be brought into close contact with the first and second heat generating components 14 and 15 by using the first and second pressing members 62 and 63. As a result, the efficiency of the heat transfer between the heat transfer unit 16 and the heat generating components 14 and 15 is improved.

The place to which the pressing members 62 and 63 are fixed is not limited to the circuit board 12, but may be the case 4. The second member 32 of the heat transfer unit 16 according to the embodiment is worked by embossing or extrusion processing to perform the passage parts 32a and the flat parts 32b as in the first embodiment. The first and second pressing members 62 and 63 may be applied to the heat transfer unit 48 of the reciprocative circulation type.

A portable computer 71 as an electronic device according to a fourth embodiment of the present invention will be described with reference to FIGS. 16 to 17. In the embodiment, like or equivalent portions are designated by like reference numerals used in portable computers 1 and 61 of the first and third embodiments. The portable computer 71 is substantially the same as that of the third embodiment in the basic construction, except that the method of forming the heat transfer unit 16 is different from that of the third embodiment.

Figure 16:
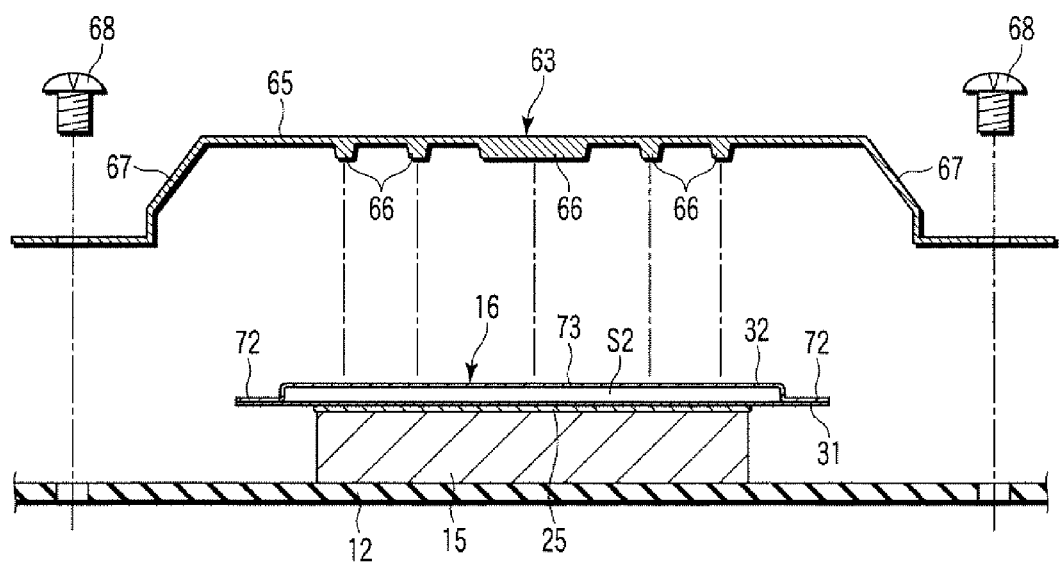
FIG. 16 is an exemplary cross-sectional view showing a method for constructing a heat transfer unit according to a fourth embodiment of the present invention.
Figure 17:
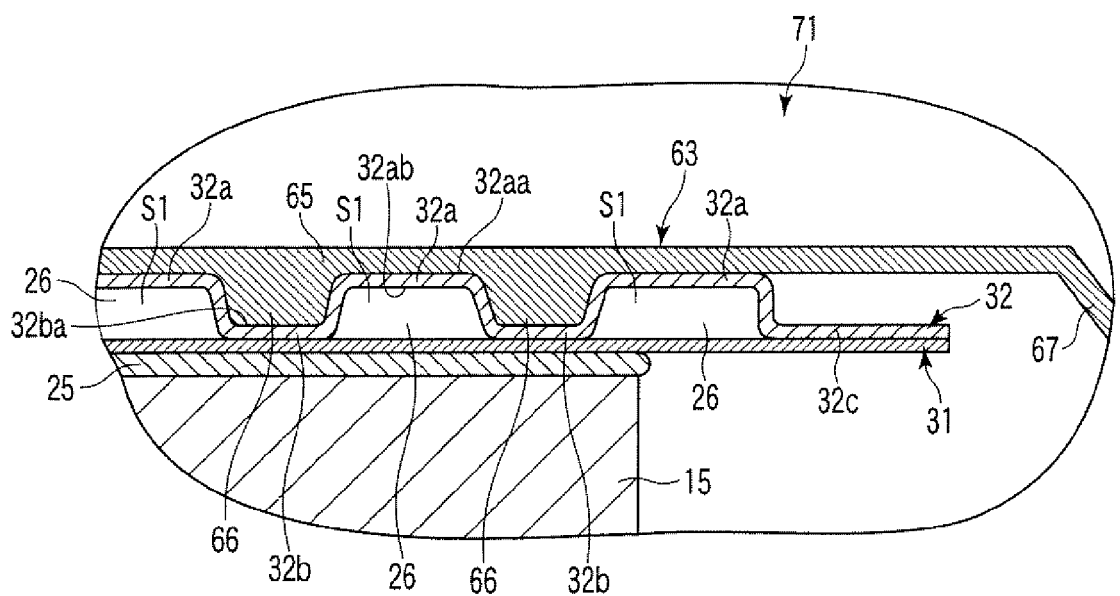
FIG. 17 is an exemplary cross-sectional view showing the heat transfer unit according to the fourth embodiment.

As shown in FIG. 16, a heat transfer unit 16 includes a first member 31 and a second member 32. The first member 31 is entirely flat. The second member 32 is prepared to include a peripheral part 72 joined to the first member 31 and a central part 73 spaced from the first member 31 by a wide space.

The first and second pressing members 62 and 63 are pressed against the second member 32 thus configured from the side opposite to the first member 31. The contact portions 66 of the first and second pressing members 62 and 63 are protruded further than a width (as viewed vertically in FIG. 16) of a space S2, for example. When the first and second pressing members 62 and 63 are pressed against the heat transfer unit 16, the areas of the second member 32, which face the contact portions 66 of the first and second pressing members 62 and 63, is plastically deformed following the contact portions 66.

The areas of the second member 32, which face the contact portions 66 of the first and second pressing members 62 and 63, form the flat parts 32b described in the first to third embodiments. The areas of the second member 32, which are located out of the contact portions 66, form passage parts 32a, which define spaces S1 to be passages 26 in cooperation with the first member 31. If compressed air is supplied to the space S2 to set up inner pressure in the heat transfer unit 16 when the first and second pressing members 62 and 63 are pressed, even the second member 32 which is not high in flexibility is easily deformable following the pressing members 62 and 63.

In the portable computer 71 thus constructed, the heat transfer unit 16 is thermally coupled to the first and second heat generating components 14 and 15 more firmly. The pressing members 62 and 63 of the embodiment apply desired designated loads to the heat transfer unit 16, with less failure of crushing the passages 26. When the pressing members 62 and 63 are used, the flat parts 32b may be formed which allow desired designated loads to be applied thereto, securing the passages 26 in the heat transfer unit 16. As a result, the efficiency of the heat transfer between the heat transfer unit 16 and the heat generating components 14 and 15 is improved.

The passage parts 32a and the flat parts 32b may be formed by pressing the pressing members 62 and 63 also against the heat transfer unit 16 not yet worked for performing the passage parts 32a and the flat parts 32b. In other words, the passage parts 32a and the flat parts 32b are formed simultaneously with mounting the pressing members 62 and 63 to the circuit board 12. As a result, the portable computer 71 can be manufactured by using a simplified manufacturing process While the present invention has been described by using the first to fourth portable computers 1, 51, 61 and 71, it is understood that the invention is not limited to those embodiments, but the components of the portable computers of the embodiments may appropriately be combined. Further, it is evident that what support the pressing members 35, 36, 62 and 63 are not limited to the case 4, the keyboard 7 or the circuit board 12.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
a case;
a heat generating component mounted in the case;
a heat radiating part provided in the case;
a heat transfer unit including a heat receiving section thermally connected to the heat generating component, a heat radiating section thermally connected to the heat radiating part, and a plurality of passages extending between the heat receiving section and the heat radiating section and through which fluid flows; and
a pressing member facing the heat transfer unit,
wherein the heat transfer unit includes first and second members being flexible and mutually bonded,
the first member is flat in shape,
the second member includes a plurality of passage parts which form spaces to be the passages between the first member and the second member, and a flat part being located between the adjacent passage parts and in contact with the first member, and
the pressing member presses the flat part toward the heat generating component, avoiding the plurality of passage parts.

2. The electronic device according to claim 1, wherein the first member is opposed to the heat generating component, and the passage parts of the second member are raised from respective edges of the flat part in a direction away from the first member, to thereby form the spaces in cooperation with the first member, and
the pressing member includes a main body covering the plurality of passage parts and a contact portion protruding from the main body to the flat part, and the contact portion is inserted between the adjacent raised passage parts to be in contact with the flat part.

3. The electronic device according to claim 2, wherein the case includes a inner wall facing the heat transfer unit, and the pressing member is a spring member compressed between the inner wall of the case and the heat transfer unit.

4. The electronic device according to claim 3, further comprising:
a second heat generating component mounted in the case; and
a second pressing member facing the heat transfer unit,
wherein the heat generating component and the second heat generating component are different in mounting height,
the heat transfer unit includes a second heat receiving section thermally connected to the second heat generating component, and bends according to a difference between the mounting height of the heat generating component and that of the second heat generating component, and
the second pressing member presses the flat part in the second heat receiving section toward the second heat generating component, avoiding the plurality of passage parts.

5. The electronic device according to claim 4, wherein the second pressing member, together with the pressing member, is supported by the inner wall of the case, and is a spring member compressed between the inner wall of the case and the heat transfer unit.

6. The electronic device according to claim 2, further comprising a keyboard,
wherein the case includes a keyboard mounting part on which the keyboard is mounted, and an opening opened into the case is formed in the keyboard mounting part, and
the pressing member is a spring member compressed between the keyboard and the heat transfer unit through the opening.

7. The electronic device according to claim 2, wherein the pressing member includes a leg fixed in the case, applying a force having a direction toward the heat generating component to the main body.

8. The electronic device according to claim 7, wherein the contact portion of the pressing member extends from one end to the other end of the main body along the flat part of the heat transfer unit.

9. The electronic device according to claim 8, wherein the second member is prepared to include a peripheral part joined to the first member and a central part spaced from the first member, the second member is pressed by the pressing member from the side opposite to the first member, an area facing the contact portion of the pressing member is deformed to form the flat part, and areas located out of the contact portion form spaces to be the passages in cooperation with the first member.

10. An electronic device comprising:
a case;
a heat generating component mounted in the case;
a heat radiating part provided in the case;
a heat transfer unit including a heat receiving section thermally connected to the heat generating component, a heat radiating section thermally connected to the heat radiating part, and a plurality of passages extending between the heat receiving section and the heat radiating section and through which fluid flows; and
a pressing member facing the heat transfer unit,
wherein the heat transfer unit includes first and second members being flexible and mutually bonded, the first member is flat in shape and faces the heat generating component, the second member is prepared to include a peripheral part joined to the first member and a central part spaced from the first member, the pressing member includes a main body and a contact portion protruding from the main body toward the second member of the heat transfer unit, and the pressing member is pressed against the heat transfer unit, an area of the second member facing the contact portion of the pressing member is deformed to form a flat part which is in contact with the first member, areas of the second member located out of the contact portion form spaces to be the passages in cooperation with the first member, and the contact portion of the pressing member presses the flat part toward the heat generating component.

* * * * *